United States Patent [19]

Alvarez

[11] Patent Number: 4,735,681

[45] Date of Patent: Apr. 5, 1988

[54] FABRICATION METHOD FOR SUB-MICRON TRENCH

[75] Inventor: Antonio R. Alvarez, Chandler, Ariz.

[73] Assignee: Motorola Inc., Schaumburg, Ill.

[21] Appl. No.: 896,685

[22] Filed: Aug. 15, 1986

[51] Int. Cl.⁴ .................. B44C 1/22; C03C 15/00
[52] U.S. Cl. .................. 156/652; 156/644; 156/653; 156/662
[58] Field of Search ........... 156/652, 662, 644, 653

[56] References Cited

U.S. PATENT DOCUMENTS 3,965,278  6/1976  Duinker et al. .............. 156/652
4,449,287  5/1984  Maas et al. .................. 156/648
4,643,798  2/1987  Takada et al. ............... 156/652
4,645,563  2/1987  Terada ........................ 156/653
4,648,937  3/1987  Ogura et al. ................ 156/653

Primary Examiner—Kenneth M. Schor
Assistant Examiner—Lori-Ann Cody
Attorney, Agent, or Firm—Robert M. Handy

[57] ABSTRACT

A method for the construction of self aligned submicron trenches by forming projecting ridges on a surface, forming a mask over the surface and then etching back the ridges to form gaps in the mask which act as guides for the etching of trenches in the substrate below.

2 Claims, 2 Drawing Sheets

FABRICATION METHOD FOR SUB-MICRON TRENCH

BACKGROUND OF THE INVENTION

The present invention pertains to a method for the fabrication of submicron, in width, trenches. Trenches are commonly used for the isolation of components on chips. At the present time these trenches are fabricated employing E beam or x-ray lithography, direct write on wafer or projection respectively. While the use of an E beam or x-rays results in narrow trenches these processes are very expensive, complicated and have very low throughput due to their complexity. Conventional optics are also employed for the fabrication of trenches. This is a less expensive and less time consuming method, but the resulting trenches are approximately 0.8 to 2 microns. These trenches are not only more difficult to refill and planarize, but due to their large size, require a large area of surface which results in larger products and is a waste of die area.

Prior art U.S. Pat. No. 4,449,287, entitled "Method of Providing a Narrow Groove or Slot in a Substrate Region, In Particular A Semiconductor Substrate Region", issued May 22, 1984, makes use of a spacer oxide which is similar to one used in the present invention, but which is realized in a different fashion. It is believed that a trench fabricated using this prior art, is limited to trenches greater than 0.5 m because of oxide encroachment from layer #7 and oxide expansion from oxide layer #3. Additionally, this prior art is more complicated and difficult to control.

SUMMARY OF THE INVENTION

The present invention pertains to a method of the fabrication of self-aligned sub-micron (0.05-0.5 m) trenches. The method involves creating ridges of specific size on a surface of a substrate. The surface is then covered with a mask. The ridges are selectively removed and the resulting gaps in the mask act as guides for the etching of trenches in the substrate.

It is an object of this invention to provide a new and improved method for the fabrication of submicron trenches.

It is a further object of this invention to provide an inexpensive and easy way to form a narrow trench without using E beam lithography.

It is a further object of this invention to provide a means for the fabrication of submicron trenches which increases the production throughput due to increased speed.

It is an advantage of this invention to provide a means for controlling the width of the trenches.

These and other objects and advantages of this invention will become apparent to those skilled in the art upon consideration of the accompanying specification, claims, and drawings.

DESCRIPTION OF THE PREFERRED EMBODIMENT

Figure 1:
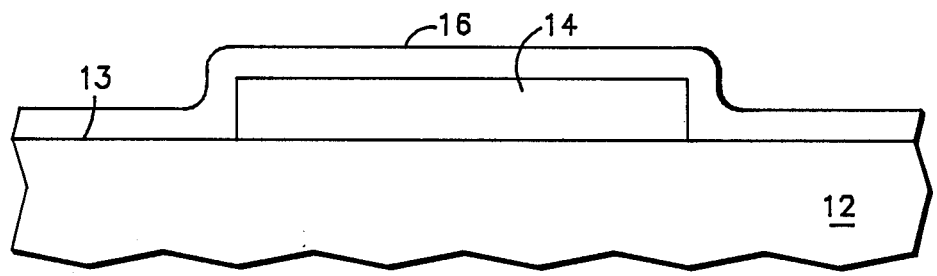
FIGS. 1-7 are enlarged fragmentary crosssectional views of a wafer showing the steps involved in the fabrication of sub-micron trenches.
Figure 2:
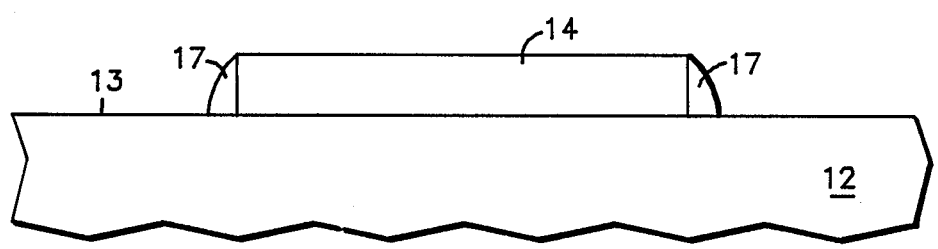

FIG. 1 is a cross-sectional side view of a substrate 12. Substrate 12 can be a semiconductor material such as silicon. Designated portions of surface 13 of substrate 12 are covered with masking material 14. This masking material, which can be many substances such as a nitride, acts as a form upon which spacer material 16, which in this specific embodiment may be composed of an oxide, is placed. Excess spacer material 16 is then removed by anisotropic etching. Since anisotropic etching works in a direction normal to the plane, all the spacer material 16 may be removed leaving projecting ridges 17 of spacer material 16 located along the sides of the mask 14 as shown in FIG. 2.

Figure 3:

FIG. 3 shows a cross-sectional view of projecting ridges 17 of spacer material 16 after mask 14 has been selectively removed. Projecting ridges 17 of spacer material 16 are variable in width determined by the thickness of masking material 14, the thickness of spacer material 16 and the time and application of the anisotropic etching.

Figure 4:
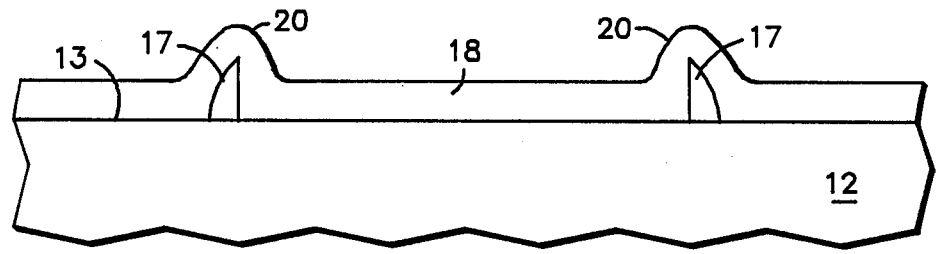

Referring to FIG. 4 it can be seen that mask 18 with projections 20 is placed over the entire surface. Projections 20 occur because of the presence of projecting ridges 17 of spacer material 16.

Figure 5:
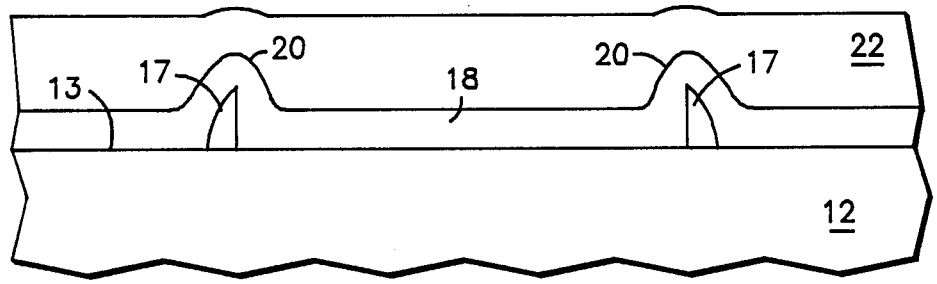
Figure 6:
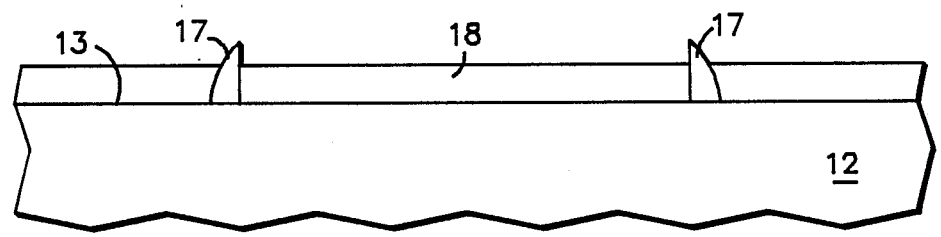

In FIG. 5 a planarizing material 22 such as glass, novalac resin, photoresist etc. is spun on the surface of the masking material. It will be understood by one skilled in the art that any planarizing technique could be used. Once the planarizing material is in place it is then etched off in a planar mode. Since the object is to remove projections 20 to expose spacer material 16, the planarizing material and the material used in the projections 20 of mask 18 must etch at approximately the same rate. When the planarizing is accomplished to the point where projecting ridges 17 of spacer material 16 are exposed as shown in FIG. 6 the planarizing is halted. The residual planarizing material can then be removed if desired.

Figure 7:
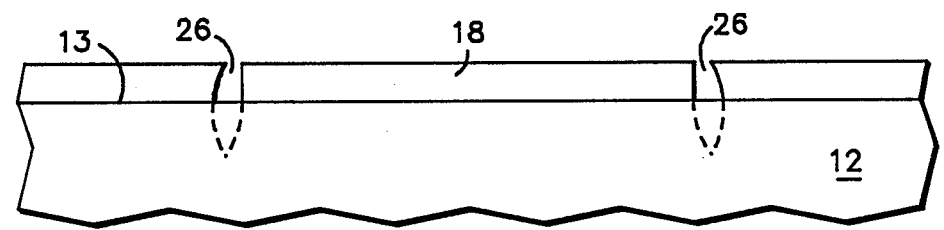

Projecting ridges 17 of spacer material 16 are now removed to form gaps 26 in masking material 18 as shown in FIG. 7. Gaps 26 in mask 18 are now used as guides for the etching of trenches into the surface below.

Since the width of gaps 26 can be controlled, the width of the trenches is similarly controlled. Trenches that range from 500 to 5000 angstroms can be fabricated, which is a size variation that has the narrowest measurement greatly reduced from the previous method of etching trenches. The narrowness of this trench conserves surface area thus resulting in smaller and more compact chips. It is also an economical production method allowing for large throughput at low cost.

Thus, while we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A method for the construction of self aligned submicron trenches in a substrate comprising the steps of:
   placing a first masking material on a substrate said first masking material having at least one side extending to said substrate;
   forming a spacer material over said first masking material and said substrate;

removing a quantity of said spacer material by anisotropically etching it and thereby leaving a quantity of said spacer material along said at least one side of the first masking material;

selectively removing said first masking material thereby leaving said spacer material in a projecting ridge;

covering said projecting ridge of said spacer material and said substrate with a second masking material;

planarizing the second masking material and exposing said projecting ridge;

etching the projecting ridge thereby forming a gap in said second masking material; and using said gap as a mask opening, etching a trench in said substrate.

2. The method of claim 1 wherein the step of planarizing includes spinning on a planarizing material and etching back until said projecting ridge of spacer material is exposed.

* * * * *